United States Patent
Chun et al.

(10) Patent No.: US 7,313,747 B2
(45) Date of Patent: Dec. 25, 2007

(54) MEASURING MICROPROCESSOR SUSCEPTIBILITY TO INTERNAL NOISE GENERATION

(75) Inventors: Sungjun Chun, Austin, TX (US); Timothy M. Skergan, Austin, TX (US); Ching Lung Tong, Highland Mills, NY (US); Roger Donell Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/388,002

(22) Filed: Mar. 23, 2006

(65) Prior Publication Data

US 2007/0236299 A1  Oct. 11, 2007

(51) Int. Cl.
*G01R 31/30* (2006.01)
(52) U.S. Cl. .................................... 714/745
(58) Field of Classification Search ........... 714/699, 714/724, 745, 799
See application file for complete search history.

(56) References Cited

U.S. PATENT DOCUMENTS

| 5,499,250 | A | * | 3/1996 | Ingalls et al. ............ 714/745 |
| 2003/0151464 | A1 | | 8/2003 | Gauthier et al. |
| 2003/0154453 | A1 | | 8/2003 | Gauthier et al. |

* cited by examiner

*Primary Examiner*—David Mis
(74) *Attorney, Agent, or Firm*—Duke W. Yee; Tom Tyson; Francis Lammes (57) ABSTRACT

A computer implemented method, testing system, computer usable program code, and apparatus are provided for measuring microprocessor susceptibility to internal noise A noise generator modulates a clock signal to generate noise on a targeted component within a microprocessor. A function generator executes microprocessor functions on a plurality of functional components within the microprocessor. A maximum execution frequency on the plurality of functional components is then measured and a set of frequency ranges where the functional components are susceptible to the generated noise is determined.

33 Claims, 4 Drawing Sheets

MEASURING MICROPROCESSOR SUSCEPTIBILITY TO INTERNAL NOISE GENERATION

BACKGROUND OF THE INVENTION

1. Field of the Invention

The present invention relates generally to an improved testing system and in particular to a computer implemented method, testing system, computer usable program code, and apparatus to measure microprocessor susceptibility. More specifically, the present invention relates to a computer implemented method, testing system, computer usable program code, and apparatus for measuring microprocessor susceptibility to internal noise generation by running targeted components while modulating adjacent components.

2. Description of the Related Art

With the ever-increasing computer system operation frequency and power dissipation of complimentary metal oxide semiconductor (CMOS) chips, variations of the on-chip switching activity can cause large variations of the current demand of a multi-processor multi-chip module (MCM). The current variations can amount to more than 100 amps within a few nanoseconds for an IBM high-performance system. The resulting mid-frequency voltage variations on the power and ground distribution system must be contained within specified noise margins with an appropriate low impedance power distribution system and decoupling capacitors on the multi-chip module and the system board to ensure system functionality. On-chip decoupling capacitors are required for high frequency power noise containment and they additionally help to reduce mid-frequency noise.

As a microprocessor draws more current and operates on lower voltage, providing a clean path to chip power distribution becomes very important. In providing a clean path to chip power distribution, decoupling capacitors have been used to provide a microprocessor with a stable voltage at different level, such as chip, substrate, and card. Traditionally, decoupling capacitors have been selected such that they protect all of the frequency ranges of interest. An impedance target, which is flat from DC to high frequency, has been used to meet the allowable noise ripples in voltage. Current solutions are conservative and expensive because they require numerous decoupling capacitors that work in different narrow frequency bands. As cost rises as one of the dominant factors in designing computer systems, defining detailed decoupling requirements are becoming more important. Defining detailed decoupling requirements makes developing a method for optimized, cost-effective decoupling solutions more critical.

SUMMARY OF THE INVENTION

The different aspects of the present invention provide a computer implemented method, testing system, computer usable program code, and apparatus for measuring microprocessor susceptibility to internal noise. A clock signal is modulated to generate noise on a targeted component within a microprocessor. Microprocessor functions are executed on a plurality of functional components within the microprocessor. A maximum execution frequency on the plurality of functional components is measured and a set of frequency ranges where the functional components are susceptible to the generated noise is determined.

In other illustrative embodiments microprocessor control interfaces are established to the microprocessor and the plurality of functional components are configured to operate in a nominal operating region. The maximum execution frequency and the generated noise are stored and a graph is graphically displayed of the maximum execution frequency as a function of the generated noise.

In other illustrative embodiments the clock signal may be modulated to generate noise within a modulation frequency range that starts at a maximum supported modulation frequency down to a determined lower modulation frequency. Additionally, the lower modulation frequency may be determined by determining that the modulation frequency no longer changes the maximum execution frequency.

In other illustrative embodiments additional microprocessor component configuration combinations of the targeted components and the functional components that should be tested may be determined. Responsive to determining the existence of additional configurations, the clock signal is modulated to generate noise on a second targeted component within the microprocessor. Microprocessor functions are executed on the plurality of functional components within the microprocessor. The maximum execution frequency on the plurality of functional components is measured and the set of frequency ranges where the functional components are susceptible to the generated noise is determined.

In other illustrative embodiments decoupling capacitors associated with the microprocessor are modified in response to determining the set of frequency ranges where the functional components are susceptible to the generated noise. The modification to the decoupling capacitors may be to reduce the amount of decoupling capacitors working in the frequency band where the microprocessor is more immune to noise or to add more decoupling capacitors working in the frequency band where the microprocessor is more susceptible to noise.

In another illustrative embodiment a request is received from a user to measure microprocessor susceptibility to internal noise and the microprocessor to be analyzed is isolated. A clock signal is modulated to generate noise on a targeted component within a microprocessor. Microprocessor functions are executed on a plurality of functional components within the microprocessor. A maximum execution frequency on the plurality of functional components is measured and a set of frequency ranges where the functional components are susceptible to the generated noise is determined. An analysis is then provided to the user of the set of frequency ranges where the functional components are susceptible to the generated noise.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
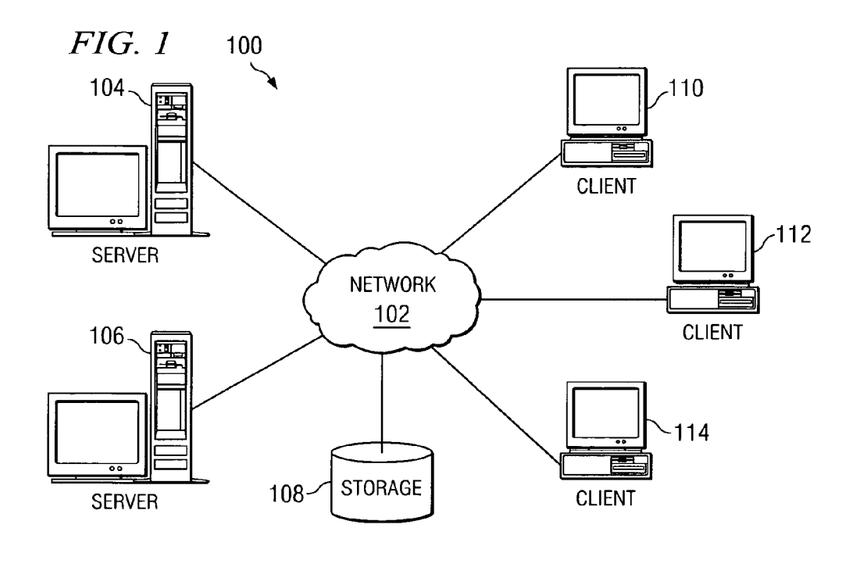
FIG. 1 is depicts a pictorial representation of a network of data processing systems in which aspects of the present invention may be implemented.
Figure 2:
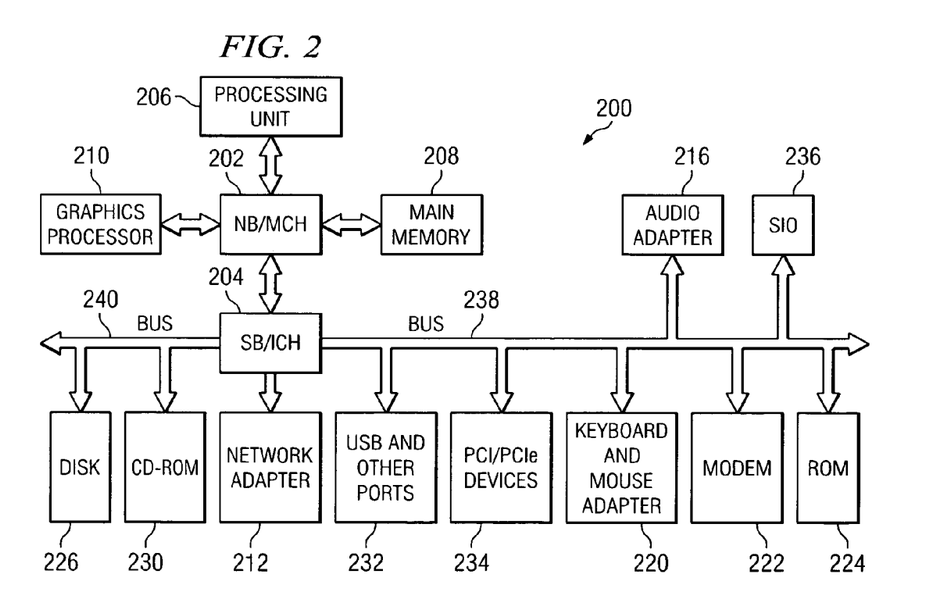
FIG. 2 depicts a block diagram of a data processing system in which aspects of the present invention may be implemented.

The illustrative embodiments relate to measuring microprocessor susceptibility to internal noise generation by running targeted components while modulating adjacent components. With reference now to the figures and in particular with reference to FIGS. 1-2, exemplary diagrams of data processing environments are provided in which embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of a network of data processing systems in which aspects of the present invention may be, implemented. Network data processing system 100 is a network of computers in which embodiments of the present invention may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for different embodiments of the present invention.

With reference now to FIG. 2, a block diagram of a data processing system is shown in which aspects of the present invention may be implemented. Data processing system 200 is an example of a computer, such as server 104 or client 110 in FIG. 1, in which computer usable code or instructions implementing the processes for embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206 and coordinates and provides control of various components within data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for embodiments of the present invention are performed by processing unit 206 using computer usable program code, which may be located in a memory such as, for example, main memory 208, ROM 224, or in one or more peripheral devices 226 and 230.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the present invention may be applied to a multiprocessor data processing system.

In some illustrative examples, data processing system 200 may be a personal digital assistant (PDA), which is configured with flash memory to provide non-volatile memory for storing operating system files and/or user-generated data.

A bus system may be comprised of one or more buses, such as bus 238 or bus 240 as shown in FIG. 2. Of course, the bus system may be implemented using any type of communication fabric or architecture that provides for a transfer of data between different components or devices attached to the fabric or architecture. A communication unit may include one or more devices used to transmit and receive data, such as modem 222 or network adapter 212 of FIG. 2. A memory may be, for example, main memory 208, ROM 224, or a cache such as found in NB/MCH 202 in FIG. 2. The depicted examples in FIGS. 1-2 and above-described examples are not meant to imply architectural limitations. For example, data processing system 200 also may be a tablet computer, laptop computer, or telephone device in addition to taking the form of a PDA.

The aspects of the present invention identify frequencies where one or more microprocessor components are more or less susceptible to incoming power supply noise. The incoming power supply noise may be generated by selectively running programmable modulation for one or more of the components comprising the microprocessor. The incoming power supply noise may be generated for entire voltage domains, while executing microprocessor functions on the targeted component and characterizing the maximum execution frequency.

Figure 3:
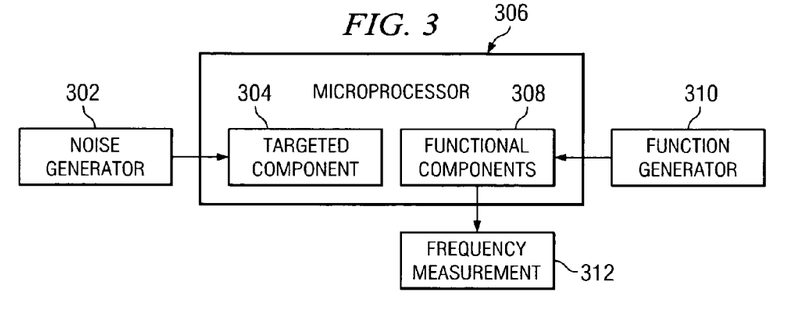
FIG. 3 depicts a diagram of components used in identifying frequencies where one or more microprocessor components are more or less susceptible to incoming power supply noise in accordance with a preferred embodiment of the present invention.

Turning now to FIG. 3, a diagram of components used in identifying frequencies where one or more microprocessor components are more or less susceptible to incoming power supply noise is depicted in accordance with a preferred embodiment of the present invention. Noise generator 302 generates localized, programmable on-chip noise at one or more voltage domains onto targeted component 304 of microprocessor 306. Microprocessor 306 may be a microprocessor located in processing unit 206 of FIG. 2. One exemplary implementation for noise generator 302 to generate localized, programmable on-chip noise is through the use of programmable clock gating. In programmable clock gating, a built-in self-test (BIST) programmable clock controller is setup to run in a continuous modulation mode. In a continuous modulation mode, the programmed value initializes an internal counter and, when the counter reaches zero, the controller is reloaded with the programmable value and simultaneously toggles a run-stop gate control to the modulated domains or components.

Microprocessor 306 may include various units, registers, buffers, memories, and other sections, all of which are formed by integrated circuitry. The various units, registers, buffers, memories, and other sections of microprocessor 306 form functional components 308 with any one particular component of functional components 308 being targeted component 304. Once localized, programmable on-chip noise is generated from noise generator 302 onto targeted component 304. Function generator 310 selectively generates microprocessor functions on the remaining chip voltage domains onto one or more functional components 308 in microprocessor 306. Frequency measurement 312 is then performed on functional components 308 to measure maximum execution frequency (Fmax) of functional components 308. The maximum execution frequency identifies the susceptibility of the microprocessor to internal noise as a function of generated noise frequencies. With the maximum execution frequency, designers may reduce the amount of decoupling capacitors working in the frequency band where the microprocessor is more immune to noise and add more decoupling capacitors working in the frequency band where the microprocessor is more susceptible to noise, thus, achieving realization of an optimized cost-effective design. An exemplary implementation of frequency measurement 312 is through the use of clock SOCE masking in conjunction with system clock gating, which is described in FIG. 4. Other noise generation and frequency measurement implementations may also be used, such as external pulse generator or external clock chip component.

Figure 4:
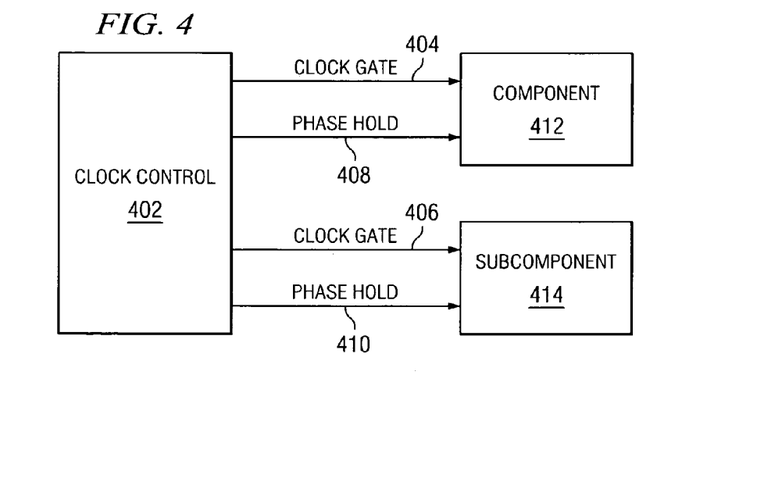
FIG. 4 depicts an exemplary diagram of clock control in identifying frequencies where one or more microprocessor components are more or less susceptible to incoming power supply noise is depicted in accordance with a preferred embodiment of the present invention.

FIG. 4 depicts an exemplary diagram of clock control used for identifying frequencies where one or more microprocessor components are more or less susceptible to incoming power supply noise in accordance with a preferred embodiment of the present invention. The primary function of clock control 402 is to start and stop domain clocks synchronously and phase aligned. Global clock gates 404 and 406 and phase holds 408 and 410 are sourced from clock control 402 and distributed to every local clock block (LCB) on the microprocessor chip. In addition, clock control 402 generates appropriate clock gates 404 and 406 signals in support of different test built-in self-test modes.

For normal system operation, i.e., system run mode, starting and stopping clocks are controlled by serial communication paths (SCOM) writes to a specific register address of clock control 402. In built-in self-test mode, domain clocks would stop after a deterministic number of nest cycle counts has been reached.

Clock control 402 signals may be segmented per domain boundaries and are extendable to component 412 and subcomponent 414 boundaries. The built-in self-test mode is primarily used for lab debug. Other modes supported by a macro within clock control 402 are system run mode, built-in self-test (BIST) stop on count or error (SOCE) mode, and clock freeze mode.

The system run mode is the default mode for normal system operations. System run mode starts and stops clocks synchronously in selected clock domains via serial communication paths operations to clock control 402 register address.

SETUP:
enable_vital_clk='1' (counter clocking enabled)
tplbc.clockmode='0' (system mode)
Clock Mask Register Address flushed to '0'(
OPERATIONAL EXAMPLE:
putscom "clock_control" FFFF CFE8 FFFF F000 (to turn on all of the clock domains)
putscom "clock_control" 8000 0000 0000 0000 (to turn on core0 clocks)
putscom "clock_control" 0000 0000 0000 0000 (to shut off all clocks)
OBSERVATIONS:
selected clock domains' clock_gates are on and c1/c2 phases are both active The built-in self-test (BIST) stop on count or error (SCOE) mode is primarily used for lab debug and diagnostics and may also be used for frequency measurement, such as frequency measurement 312 of FIG. 3. The BIST SOCE mode allows a user to program and fire a pre-determined number of clocks to one or more clock domains phase synchronously while the rest of the chip remains in system run mode.

SETUP:
enable_vital_clk='1' (counter clocking enabled)
tplbc.clockmode='0' (system mode)
Clock Mask Register Address flushed to '0'

OPERATIONAL EXAMPLE:
1) quiesce clock domains to be SOCE'ed
2) select domain(s) that are to be SOCE'ed in Clock Mask Register Address
3) enable SOCE mode and program number of cycles (in nest cycle) in Clock SOCE Control Register Address.
4) Start SOCE putscom "clock_control" 0000 0000 0000 0008
5) after SOCE is complete, disable SOCE mode and reset Clock Mask Register OBSERVATIONS:
Selected clock domains' clock_gates and c1/c2 active for number of cycles programmed EXAMPLE: SOCE nest domain
1) putscom "Clock Mask Register Address" 0000 8000 0000 0000 (mask nest clock domain)
2) putscom "SOCE Control Register Address" 0010 0000 0000 0008 (enable soce mode and program 8 cycles)
3) putscom "clock_control" 0000 0000 0000 0008 (Start Soce Test)

In clock freeze mode clock domains are selected and the duty cycles are programmed for clock gating clocks that supports package electrical measurement.

SETUP:
enable_vital_clk='1' ((turn on clock to counter)
tplbc.clockmodes='00' (system mode)
Clock Mask Register Address flushed to '0'
Clock Mode Control Register Addr
  bit 12='0'
  bit 14='0'
  bit 18='1'---duty cycle adjust
  bit 22-63=program number that is the base modulation frequency
Clock Ratio Control Register Addr

| Bit 44-47 | Duty cycle |
|---|---|
| 000 | 50-50 |
| 001 | NA |
| 010 | 25-75 |
| 011 | 12-88 |
| 100 | 50-50 |
| 101 | NA |
| 110 | 75-25 |
| 111 | 88-12 |

Figure 5:
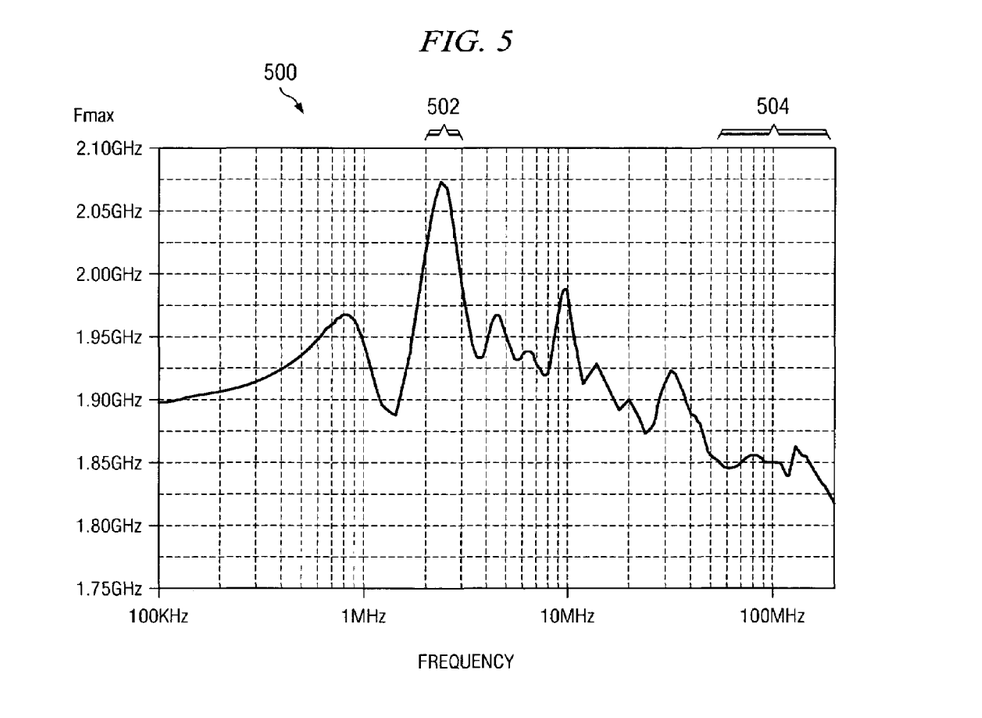
FIG. 5 depicts an exemplary output of a maximum execution frequency (Fmax) on microprocessor components in accordance with a preferred embodiment of the present invention.

OPERATIONS:
start all clocks via PSCOM
putscom Clock Mask Register addr for domains to be modulated
enable start_soce_test:
  putscom Clock Control Register 0000 0000 0000 0008
Modulated clocks running indefinitely
Clock Mode Control Register Addr
  Control Bit='0' to turn off all modulating clocks
stop all clocks via PSCOM OBSERVATIONS:
all domains clocks turn on
domains that have been "masked" in the Clock Mask Register whose clocks would modulate FIG. 5 depicts an exemplary output of a maximum execution frequency (Fmax) on microprocessor components in accordance with a preferred embodiment of the present invention. Maximum execution frequency (Fmax) graph 500 depicts that the microprocessor is less susceptible to the internally injected noise in section 502, which is between 2 MHz and 3 MHz, and more susceptible to the noise in section 504, which is above 50 MHz. The output shown in maximum execution frequency (Fmax) graph 500 may be used in defining a new impedance target which is not flat across the frequency of interest. For example, system designers may reduce the amount of decoupling capacitors working in the frequency band where the microprocessor is more immune to noise, which is between 2 MHz and 3 MHz, and add more decoupling capacitors working in the frequency band where the microprocessor is more susceptible to noise, which is above 50 MHz. This type of system design may result in a more optimized cost-effective system design.

Figure 6:
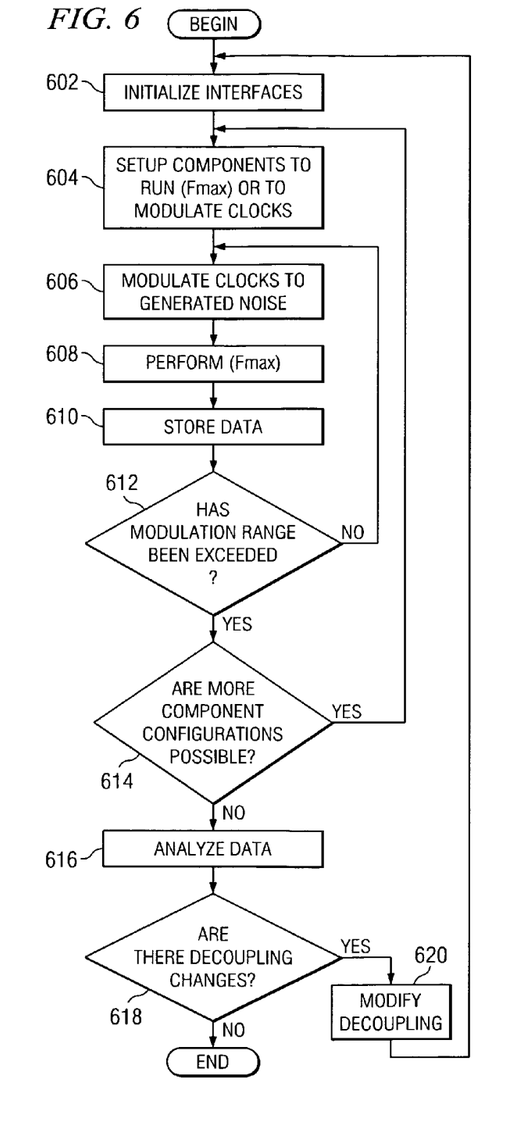
FIG. 6 is a flow diagram of the operation for measuring microprocessor susceptibility to internal noise in accordance with a preferred embodiment of the present invention.

FIG. 6 is a flow diagram of the operation for measuring microprocessor susceptibility to internal noise in accordance with a preferred embodiment of the present invention. As the operation begins, the microprocessor and any microprocessor control interfaces are established (step 602). The components within the microprocessor are each configured to run in a nominal operating region, and the component division is chosen such that components are in either the maximum execution frequency (FMax) set or the modulated-clock set (step 604). The maximum execution frequency (FMax) set may be functional component set 308 and the modulated-clock set may be targeted component 304 of FIG. 3. The clocks are them modulated at a target modulation frequency within the modulation frequency range that is considered a set of frequency ranges, typically starting with at the maximum supported modulation frequency down to a lower frequency that is determined by data analysis, which occurs later in the operation (step 606). A functional Fmax is then measured on the microprocessor (step 608) and the measured Fmax and modulation values are read and stored (step 610).

A determination is then made whether the modulation has past the modulating range and changes in the Fmax are still significant (step 612). There are two considerations in determining a modulation range. The first is a physical limitation of the noise generator. For example, the pulse generator range, in the case of the external modulation, or the magnitude of the clock counter, in the case of internal noise generation. Typically, the magnitude of the range for the noise generator is greater than the interesting range of the susceptibility measurements. The interesting range is typically bounded by the magnitude of the noise generator at which changes in Fmax are no longer observed. If the modulation range has not been exceeded, the operation returns to step 606 for the next lower modulation frequency. If at step 612, the modulation range has been exceeded, the operation then determines if there are more component configuration combinations to be measured (step 614). The combination of component configurations is determined by the granularity of component grouping which can minimally perform the intended function for that grouping, as determined by knowledge of the system functions. If there are more configurations to be measured, the operation returns to step 604 for the next component configuration. If at step 614, there are no more configurations to be measured, the stored data is analyzed (step 616). Based upon the analyzed data, a decision is made based on the data analysis to modify the decoupling capacitors (step 618). If a decision is made to modify the decoupling capacitors, the decoupling capacitors are modified (step 620) and the measurement is returned to step 602 to verify the modifications have produced the intended effect. If at step 618, no necessary modifications are determined, the operation ends.

In an alternative embodiment, a customer may have a design for a microprocessor that the customer would like to determine the microprocessor design's susceptibility to internal noise generation. Implementation of this type of operation may be performed over a network, such as network 102 of FIG. 1, or by downloading a program to be stored in a memory and run by a processor, such as main memory 208 and processing unit 206 of FIG. 2. In performing the operation over a network the testing system may isolate the processor from other ongoing operation to perform the analysis. In a program download operation, the customer may download a program and perform the analysis personally.

Figure 7:
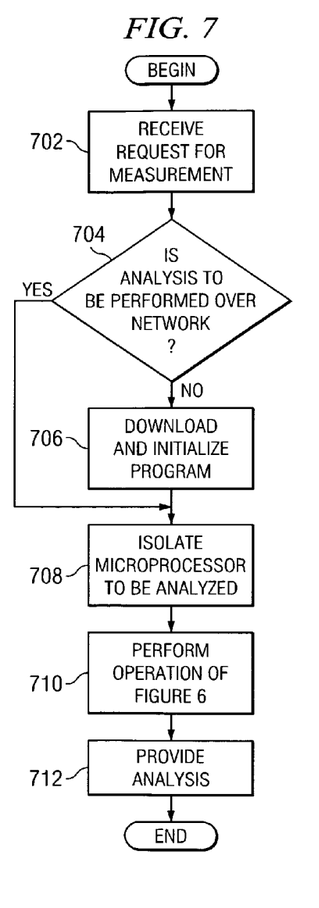
FIG. 7 depicts a flow diagram of a customer requested analysis operation for measuring microprocessor susceptibility to internal noise in accordance with a preferred embodiment of the present invention.

FIG. 7 depicts a flow diagram of a customer requested analysis operation for measuring microprocessor susceptibility to internal noise in accordance with a preferred embodiment of the present invention. As the operation begins a request for measuring microprocessor susceptibility to internal noise is received (step 702). A determination is made as to whether the measurement is to be performed over a network (step 704). If the measurement is not performed over a network, an application may be downloaded to a memory of the customer's system and executed by a processor in the customer's system (step 706). Whether the measurement is performed locally or over a network, the operation then isolates the microprocessor that is to be tested (step 708). Then the operation performs the steps described in FIG. 6 (step 710). Once the operation in step 710 is complete, the stored analyzed data is provided to the customer so that a decision may be made by the customer as to whether to modify the decoupling capacitors (step 712), with the operation ending thereafter.

The aspects of the present invention identify frequencies where one or more microprocessor components are more or less susceptible to incoming power supply noise. The incoming power supply noise may be generated by selectively running programmable modulation for one or more of the components comprising the microprocessor. The incoming power supply noise may be generated for entire voltage domains, while executing microprocessor functions on the targeted component and characterizing the maximum execution frequency.

Once the susceptibility of the microprocessor to internal noise as a function of frequencies is identified, a new impedance target that is not flat across the frequency of interest may be defined. With the defined impedance, designers may reduce the amount of decoupling capacitors working in the frequency band where microprocessor is more immune to noise and add more decoupling capacitors working in the frequency band where microprocessor is more susceptible to noise, thus, achieving realization of an optimized cost-effective design.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for measuring microprocessor susceptibility to internal noise, the computer implemented method comprising:

modulating a clock signal to generate noise on a targeted component within a microprocessor;

executing microprocessor functions on a plurality of functional components within the microprocessor;

measuring a maximum execution frequency on the plurality of functional components; and determining a set of frequency ranges where the functional components are susceptible to the generated noise.

2. The computer implemented method of claim 1, further comprising:

establishing microprocessor control interfaces to the microprocessor.

3. The computer implemented method of claim 1, further comprising:
configuring the plurality of functional components to operate in a nominal operating region.

4. The computer implemented method of claim 1, further comprising:
storing the maximum execution frequency and the generated noise; and
graphically displaying a graph of the maximum execution frequency as a function of the generated noise.

5. The computer implemented method of claim 1, wherein the clock signal is modulated to generate noise within a modulation frequency range that starts at a maximum supported modulation frequency down to a determined lower modulation frequency.

6. The computer implemented method of claim 5, wherein the lower modulation frequency is determined by determining that the modulation frequency no longer changes the maximum execution frequency.

7. The computer implemented method of claim 1, further comprising:
determining if there are additional microprocessor component configuration combinations of the targeted components and the functional components that should be tested;
responsive to determining the existence of additional configurations, modulating the clock signal to generate noise on a second targeted component within the microprocessor;
executing microprocessor function on the plurality of functional components within the microprocessor;
measuring the maximum execution frequency on the plurality of functional components; and
determining the set of frequency ranges where the functional components are susceptible to the generated noise.

8. The computer implemented method of claim 1, further comprising:
responsive to determining the set of frequency ranges where the functional components are susceptible to the generated noise, modifying decoupling capacitors associated with the microprocessor.

9. The computer implemented method of claim 8, wherein the modification to the decoupling capacitors is to reduce the amount of decoupling capacitors working in the frequency band where microprocessor is more immune to noise.

10. The computer implemented method of claim 8, wherein the modification to the decoupling capacitors is to add more decoupling capacitors working in the frequency band where microprocessor is more susceptible to noise.

11. A computer implemented method for measuring microprocessor susceptibility to internal noise, the computer implemented method comprising:
receiving a request from a user to measure microprocessor susceptibility to internal noise;
isolating a microprocessor to be analyzed;
modulating a clock signal to generate noise on a targeted component within the microprocessor;
executing microprocessor functions on a plurality of functional components within the microprocessor;
measuring a maximum execution frequency on the plurality of functional components; and
determining a set of frequency ranges where the functional components are susceptible to the generated noise.

12. The computer implemented method of claim 11, further comprising:
providing an analysis to the user of the set of frequency ranges where the functional components are susceptible to the generated noise.

13. A testing system comprising:
a microprocessor;
a noise generator, wherein the noise generator modulates a clock signal to generate noise on a targeted component within the microprocessor;
a function generator, wherein the function generator executes microprocessor functions on a plurality of functional components within the microprocessor;
a measurement device, wherein the measurement device measures a maximum execution frequency on the plurality of functional components; and
a determining device, wherein the determining device determines a set of frequency ranges where the functional components are susceptible to the generated noise.

14. The testing system of claim 13, wherein microprocessor control interfaces are established to the microprocessor.

15. The testing system of claim 13, wherein the plurality of functional components are configured to operate in a nominal operating region.

16. The testing system of claim 13, wherein the maximum execution frequency and the generated noise are stored; and wherein a graph of the maximum execution frequency as a function of the generated noise is graphically displayed.

17. The testing system of claim 13, wherein the clock signal is modulated to generate noise within a modulation frequency range that starts at a maximum supported modulation frequency down to a determined lower modulation frequency.

18. The testing system of claim 17, wherein the lower modulation frequency is determined by determining that the modulation frequency no longer changes the maximum execution frequency.

19. The testing system of claim 13, wherein the determining device determines if there are additional microprocessor component configuration combinations of the targeted components and the functional components that should be tested;
wherein the noise generator modulates the clock signal to generate noise on a second targeted component within the microprocessor in response to determining the existence of additional configurations;
wherein the function generator executes microprocessor function on the plurality of functional components within the microprocessor;
wherein the measuring device measures the maximum execution frequency on the plurality of functional components; and
wherein the determining device determines the set of frequency ranges where the functional components are susceptible to the generated noise.

20. The testing system of claim 13, wherein decoupling capacitors associated with the microprocessor are modified in response to determining the set of frequency ranges where the functional components are susceptible to the generated noise.

21. The testing system of claim 20, wherein the modification to the decoupling capacitors is to reduce the amount of decoupling capacitors working in the frequency band where microprocessor is more immune to noise.

22. The testing system of claim 20, wherein the modification to the decoupling capacitors is to add more decoupling capacitors working in the frequency band where microprocessor is more susceptible to noise.

23. A computer program product comprising:
a computer usable medium including computer usable program code for measuring microprocessor susceptibility to internal noise, the computer program product including:
computer usable program code for modulating a clock signal to generate noise on a targeted component within a microprocessor;
computer usable program code for executing microprocessor functions on a plurality of functional components within the microprocessor;
computer usable program code for measuring a maximum execution frequency on the plurality of functional components; and
computer usable program code for determining a set of frequency ranges where the functional components are susceptible to the generated noise.

24. The computer program product of claim 23, further including:
computer usable program code for establishing microprocessor control interfaces to the microprocessor.

25. The computer program product of claim 23, further including:
computer usable program code for configuring the plurality of functional components to operate in a nominal operating region.

26. The computer program product of claim 23, further including:
computer usable program code for storing the maximum execution frequency and the generated noise; and
computer usable program code for graphically displaying a graph of the maximum execution frequency as a function of the generated noise.

27. The computer program product of claim 23, wherein the clock signal is modulated to generate noise within a modulation frequency range that starts at a maximum supported modulation frequency down to a determined lower modulation frequency.

28. The computer program product of claim 27, wherein the lower modulation frequency is determined by determining that the modulation frequency no longer changes the maximum execution frequency.

29. The computer program product of claim 23, further including:
computer usable program code for determining if there are additional microprocessor component configuration combinations of the targeted components and the functional components that should be tested;
computer usable program code for responsive to determining the existence of additional configurations, modulating the clock signal to generate noise on a second targeted component within the microprocessor;
computer usable program code for executing microprocessor function on the plurality of functional components within the microprocessor;
computer usable program code for measuring the maximum execution frequency on the plurality of functional components; and
computer usable program code for determining the set of frequency ranges where the functional components are susceptible to the generated noise.

30. The computer program product of claim 23, further including:
computer usable program code for modifying decoupling capacitors associated with the microprocessor in response to determining the set of frequency ranges where the functional components are susceptible to the generated noise.

31. The computer program product of claim 30, wherein the modification to the decoupling capacitors is to reduce the amount of decoupling capacitors working in the frequency band where microprocessor is more immune to noise.

32. The computer program product of claim 30, wherein the modification to the decoupling capacitors is to add more decoupling capacitors working in the frequency band where microprocessor is more susceptible to noise.

33. An apparatus for measuring microprocessor susceptibility to internal noise, the apparatus comprising:
modulating means for modulating a clock signal to generate noise on a targeted component within a microprocessor;
executing means for executing microprocessor functions on a plurality of functional components within the microprocessor;
measuring means for measuring a maximum execution frequency on the plurality of functional components; and
determining means for determining a set of frequency ranges where the functional components are susceptible to the generated noise.

* * * * *